United States Patent
Shirasaki et al.

(10) Patent No.: US 8,467,035 B2
(45) Date of Patent: Jun. 18, 2013

(54) PELLICLE FRAME AND LITHOGRAPHIC PELLICLE

(75) Inventors: Toru Shirasaki, Gunma (JP); Kishore Chakravorty, Santa Clara, CA (US); David Mushell, Santa Clara, CA (US); Grace Ng, Santa Clara, CA (US)

(73) Assignees: Shin-Etsu Chemical Co., Ltd., Tokyo (JP); Intel Corporation, Santa Clara, CA (US)

( * ) Notice: Subject to any disclaimer, the term of this patent is extended or adjusted under 35 U.S.C. 154(b) by 283 days.

(21) Appl. No.: 12/819,486

(22) Filed: Jun. 21, 2010

(65) Prior Publication Data

US 2010/0328641 A1    Dec. 30, 2010

(30) Foreign Application Priority Data

Jun. 24, 2009    (JP) ................... 2009-149775

(51) Int. Cl.
*G03B 27/62*    (2006.01)
*G03F 1/62*    (2012.01)

(52) U.S. Cl.
USPC ............................... 355/75; 430/5

(58) Field of Classification Search
USPC .................. 355/72–76; 430/5, 20; 428/14
See application file for complete search history.

(56) References Cited

U.S. PATENT DOCUMENTS

| 5,422,704 | A  | * | 6/1995  | Sego .............................. 355/53 |
| 6,795,170 | B2 | * | 9/2004  | Mishiro et al. .................. 355/75 |
| 7,829,248 | B2 | * | 11/2010 | Lin et al. ........................... 430/5 |
| 8,026,023 | B2 | * | 9/2011  | Hamada ............................. 430/4 |
| 8,221,945 | B2 | * | 7/2012  | Shirasaki et al. ................. 430/5 |
| 2008/0213679 | A1 |   | 9/2008  | Miyakawa et al. |
| 2009/0023082 | A1 |   | 1/2009  | Shirasaki ........................ 450/5 |
| 2009/0191470 | A1 |   | 7/2009  | Shirasaki ........................ 430/5 |

FOREIGN PATENT DOCUMENTS

| CN | 10349875 A   | 1/2009  |
| CN | 101349874 A  | 1/2009  |
| EP | 1 978 404    | 10/2008 |
| EP | 2 017 672    | 1/2009  |
| JP | 9-68793      | 3/1997  |
| JP | 09-068793    | 3/1997  |
| JP | 2009-25562 A1 | 2/2009 |

OTHER PUBLICATIONS

Chinese Office Action issued in counterpart application No. 2012082001172320 mailed Aug. 23, 2012 (4 pages).
Extended European Search Report mailed Mar. 5, 2013 in counterpart application No. 10167075.0 (8 pages).

* cited by examiner

*Primary Examiner* — Hung Henry Nguyen
(74) *Attorney, Agent, or Firm* — Kratz, Quintos & Hanson, LLP

(57) ABSTRACT

A pellicle frame is provided that includes a pellicle frame bar having a cross-section with a shape that has at least one triangular recess in at least one side edge of a quadrilateral having an upper edge and a lower edge parallel to each other and a cross-sectional area of no greater than 20 mm². There is also provided a lithographic pellicle that includes a pellicle film stretched over one end face of the pellicle frame via a pellicle film adhesive, and that includes an exposure master plate adhesive on the other end face.

12 Claims, 4 Drawing Sheets

PELLICLE FRAME AND LITHOGRAPHIC PELLICLE

TECHNICAL FIELD

The present invention relates to a pellicle frame and a lithographic pellicle used as a debris shield for a lithography mask when producing a liquid crystal display panel or a semiconductor device such as an LSI or a ULSI.

BACKGROUND ART

In the production of a semiconductor such as an LSI or a ULSI or the production of a liquid crystal display panel, a pattern is formed by irradiating a semiconductor wafer or a liquid crystal master plate with light; if debris is attached to an exposure master plate, since the debris absorbs the light or refracts the light, there are problems that the replicated pattern is deformed, the edges become rough, or the background is stained black, thus impairing the dimensions, quality, appearance, etc. The 'exposure master plate' referred to in the present invention is a general term for lithography masks (also called simply 'masks') and reticles. The explanation below is given for a mask as an example.

These operations are usually carried out in a clean room, but even within a clean room it is difficult to always keep the exposure master plate clean, and a method is therefore employed in which a pellicle film that allows exposure light to easily pass through is affixed to the surface of the exposure master plate to act as a debris shield.

The pellicle is basically constituted of a pellicle frame and a pellicle film stretched over the frame. The pellicle film is formed from nitrocellulose, cellulose acetate, a fluorine-based polymer, etc., which allows exposure light (g rays, i rays, 248 nm, 193 nm, etc.) to easily pass through. The pellicle film is adhered by coating the upper end part of the pellicle frame with a good solvent for the pellicle film and air-drying or by means of an adhesive such as an acrylic resin, an epoxy resin, or a fluorine resin. Furthermore, in order to mount an exposure master plate, a lower end part of the pellicle frame is provided with a pressure-sensitive adhesion layer made of a polybutene resin, a polyvinyl acetate resin, an acrylic resin, a silicon resin, etc. and a reticle pressure-sensitive adhesive protecting liner for the purpose of protecting the pressure-sensitive adhesive layer.

The pellicle is installed so as to surround a pattern region formed on the surface of the exposure master plate. Since the pellicle is provided in order to prevent debris from becoming attached to the exposure master plate, this pattern region and a pellicle outer part are separated so that dust from the pellicle outer part does not become attached to the pattern face.

In recent years, the LSI design rule has shrunk to sub-quarter micron, and accompanying this the wavelength of the exposure light source is being shortened, that is, instead of g rays (436 nm) and i rays (365 nm) from the hitherto predominant mercury lamp, a KrF excimer laser (248 nm), an ArF excimer laser (193 nm), etc. are being used. As shrinkage advances, the flatness required for the mask and silicon wafer becomes more strict.

A pellicle is affixed to a mask in order to shield the pattern from debris after the mask is completed. When a pellicle is affixed to the mask, the mask flatness can sometimes change. When the mask flatness is degraded, as described above there is the possibility that problems such as defocusing will occur. Furthermore, when the flatness changes, the pattern shape drawn on the mask changes, and this brings about the difficulty that problems occur with the precision of superimposition of the mask.

There are several factors involved in the change in mask flatness due to a pellicle being affixed, but it has been found that the largest factor is the flatness of the pellicle frame.

In order to prevent deformation of a mask due to deformation of a pellicle frame, JP-A-2009-25562 (JP-A denotes a Japanese unexamined patent application publication) discloses reducing the cross-sectional area of the pellicle frame to 6 mm$^2$ or less or using a material having a Young's modulus of 50 GPa or less in the pellicle frame.

Many pellicle frames have a rectangular cross-sectional shape, and JP-A-9-68793 discloses a pellicle frame for which the cross-section has a shape in which an upper end side of an inner peripheral face projects further inward than a lower end side.

DISCLOSURE OF INVENTION

Problems to be Solved by the Invention

In recent years, with regard to the flatness required for a mask, from a flatness of 2 μm on the pattern face the requirement is gradually becoming more strict, and for the 65 nm node process and beyond, 0.5 μm or less and preferably 0.25 μm is now required.

In general, the flatness of a pellicle frame is in the order of 20 to 80 μm, but if a pellicle employing a pellicle frame having poorer flatness than a mask is affixed to the mask, the shape of the frame is transferred to the mask, thus causing deformation in the mask. When affixing, the pellicle is pressed against the mask with a large force of about 200 to 400 N (20 to 40 kgw). Since the flatness of the mask surface is better than the flatness of the pellicle frame, when pressing of the pellicle against the mask is completed, the pellicle frame attempts to return to its original shape, and the pellicle frame thereby causes the mask to deform.

When the mask is deformed, the mask flatness can sometimes be degraded, and in this case the problem of defocusing within an exposure device occurs. On the other hand, deformation of the mask can sometimes improve the flatness, but even in this case a pattern formed on the mask surface is distorted, and as a result the problem that a pattern image replicated on a wafer by exposure being distorted occurs. Since this distortion of the pattern also occurs when the mask flatness is degraded, when the mask ends up being deformed by affixing the pellicle, the problem of the pattern image being distorted always occurs.

It is a first object of the present invention to provide a pellicle frame that can suppress deformation of an exposure master plate due to deformation of the pellicle frame even if a pellicle is affixed to the exposure master plate.

It is a second object of the present invention to provide a lithographic pellicle having such a pellicle frame.

Means for Solving the Problems

The above-mentioned objects of the present invention have been accomplished by means (1) and (12) below. They are described together with (2) to (11), which are preferred embodiments.

(1) A pellicle frame comprising a pellicle frame bar having a cross-section with a shape that has at least one triangular recess in at least one side edge of a quadrilateral having an upper edge and a lower edge parallel to each other and an area of no greater than 20 mm$^2$, (2) the pellicle frame according to (1) above, wherein the quadrilateral is a rectangle, and said at least one recess is a triangle that has an edge parallel to the upper edge of the rectangle,
(3) the pellicle frame according to (1) above, wherein the quadrilateral is a rectangle, and said at least one recess is an isosceles triangle having a vertex placed inside the rectangle,
(4) the pellicle frame according to any one of (1) to (3) above, wherein the quadrilateral has one recess in each of opposite side edges, and a straight line that passes through an extremity of one recess and is perpendicular to the upper edge of the rectangle crosses the other recess,
(5) the pellicle frame according to any one of (1) to (4) above, wherein the pellicle frame bar has a cross-sectional area of no greater than 6 mm$^2$, preferably of at least 1 mm$^2$ but no greater than 6 mm$^2$,
(6) the pellicle frame according to any one of (1) to (5) above, wherein the pellicle frame is formed from a material having a Young's modulus of 1 to 80 GPa,
(7) The pellicle frame according to any one of (1) to (6), wherein the pellicle frame is formed from a material selected from the group consisting of an aluminum alloy, a magnesium alloy, and a polycarbonate resin,
(8) The pellicle frame according to any one of (1) to (7), wherein the pellicle frame is formed from an aluminum alloy,
(9) The pellicle frame according to any one of (1) to (8), wherein the pellicle frame has a flatness of at least 0 μm but no greater than 20 μm,
(10) The pellicle frame according to any one of (1) to (9), wherein the quadrilateral has an area of at least 4 mm$^2$ but no greater than 20 mm$^2$,
(11) The pellicle frame according to any one of (1) to (10), wherein the cross-section of the pellicle frame bar has a shape in which an upper end part and a lower end part having a constant thickness throughout the width are connected by a middle part having a constant width along one diagonal of the quadrilateral,
(12) A lithographic pellicle comprising a pellicle film stretched over one end face of the pellicle frame according to any one of (1) to (11) via a pellicle film adhesive, and comprising an exposure master plate adhesive on the other end face.

Figure 1:
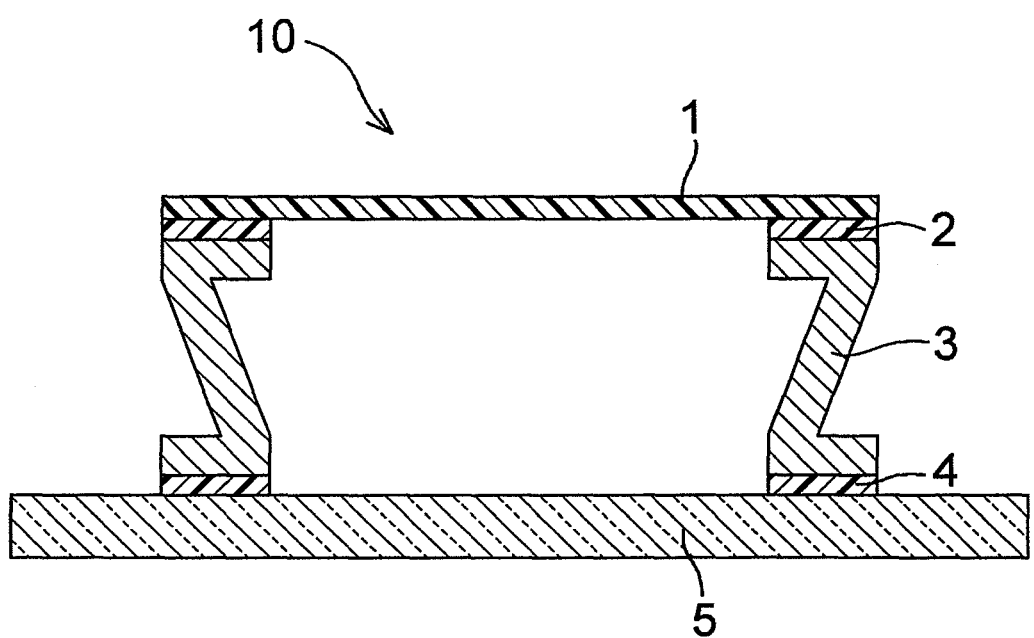
FIG. 1 is an example of a schematic cross-sectional diagram showing a constitutional example of a pellicle.

| EXPLANATION OF REFERENCE NUMERALS AND SYMBOLS | |
| --- | --- |
| 1: | Pellicle film |
| 2: | Adhesion layer |
| 3: | Pellicle frame |
| 4: | Pressure-sensitive adhesion layer |
| 5: | Exposure master plate |
| 10: | Pellicle |
| 12: | Upper edge |
| 13: | Upper end part |
| 14: | Lower edge |
| 15: | Lower end part |

| EXPLANATION OF REFERENCE NUMERALS AND SYMBOLS | |
| --- | --- |
| 16: | Middle part |
| 17: | Side edge |
| 18: | Triangle |
| 19: | Side edge |
| A, B: | Extremity of recess |

MODES FOR CARRYING OUT THE INVENTION

The pellicle frame of the present invention comprises a pellicle frame bar having a cross-section with a shape that has at least one triangular recess in at least one side edge of a quadrilateral having an upper edge and a lower edge parallel to each other and an area of no greater than 20 mm$^2$.

Furthermore, the lithographic pellicle of the present invention (hereinafter, also called simply a 'pellicle') comprises a pellicle film stretched over one end face of the pellicle frame via a pellicle film adhesive, and an exposure master plate adhesive on the other end face.

Figure 2:
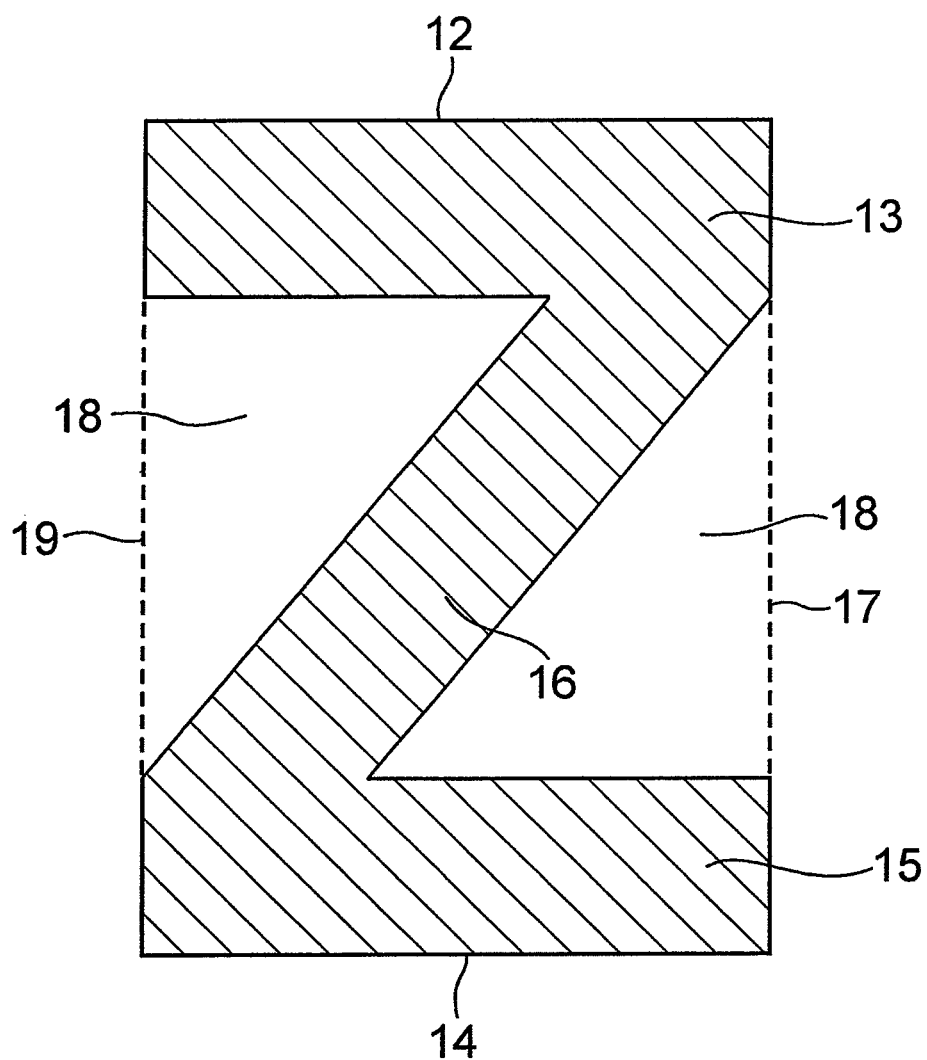
FIG. 2 is a diagram showing one example of the cross-sectional shape of a pellicle frame bar.

The general outline of the pellicle frame and the pellicle of the present invention is explained by referring to FIG. 1 and FIG. 2.

As shown in FIG. 1, a lithographic pellicle 10 of the present invention is formed by stretching a pellicle film 1 over an upper end face of a pellicle frame 3 via an adhesion layer 2 for affixing the pellicle film. In this case, a pressure-sensitive adhesion layer 4 for adhering the lithographic pellicle 10 to an exposure master plate (mask or reticle) 5 is usually formed on a lower end face of the pellicle frame 3, and a liner (not illustrated) is detachably adhered to a lower end face of the pressure-sensitive adhesion layer 4. The pellicle frame 3 may be provided with an atmospheric pressure adjustment hole (vent) (not illustrated) and, furthermore, this vent may be provided with a dust filter (not illustrated) for the purpose of removing particles.

The pellicle frame may be provided with a jig hole. The shape of the jig hole in the depth direction is not specified, and may be a recess having a taper at the extremity of a column as long as it does not pass completely through.

The cross-sectional shape of the vicinity of the position where the jig hole is provided is preferably a quadrilateral prior to a triangle being removed, and is preferably a rectangle.

With regard to the position where the atmospheric pressure adjustment hole is provided, since an atmospheric pressure adjustment filter is generally affixed to an outer face of the pellicle frame, the outer face may be free from cutting and have a flat face for the filter to be affixed, and an inner face may be provided with cutting.

As shown in FIG. 2, with regard to the pellicle frame of the present invention, the cross-section of the pellicle frame bar has a shape in which an upper end part 13 containing an upper edge 12 and a lower end part 15 containing a lower edge 14 are connected by a middle part 16 obtained by removing triangles 18 from opposing side edges 17 and 19 of a quadrilateral as a basis, the quadrilateral having the upper edge 12 and the lower edge 14 parallel to each other (hereinafter, also called a 'basic quadrilateral'; formed from the four edges 12, 17, 14, and 19).

(Pellicle Frame)

As hereinbefore described, it is thought that distortion of a mask caused by affixing a pellicle to the mask is mainly due to distortion of the pellicle frame of the pellicle. When affixing, the pellicle frame is deformed, and deformation stress caused by it returning to its original shape makes the mask deform. This deformation stress depends on the Young's modulus and the amount of deformation of the material constituting the pellicle frame. In accordance with the present invention, it becomes possible by reducing the cross-sectional area of the pellicle frame to less than that of the basic quadrilateral to provide a pellicle frame for which the deformation stress when affixing the pellicle to a mask is small.

Conventionally, since a pellicle film is stretched over an upper edge of the pellicle frame and the mask is adhered to the lower edge by providing a pressure-sensitive adhesive, it is necessary for the upper edge and the lower edge to have a certain degree of width. Therefore, the conventional pellicle frame having a rectangular cross-section has large deformation stress. However, in accordance with the present invention, a middle part connecting the upper end part and the lower end part can be made to have a narrower width than both the upper and lower edges. In this way, by making the middle part have a narrower width than both the upper and lower edges, it is possible to reduce the cross-sectional area of the frame while maintaining the width of the upper and lower edges and the height of the frame. The deformation stress can therefore be reduced without impairing the workability. Such a pellicle frame may be produced by for example cutting out a triangle from at least one side edge of a frame having a cross-section in a basic quadrilateral shape.

It is preferable that no cutting is in a location of the pellicle frame where a jig hole is provided and that a predetermined jig hole is provided which does not pass completely through.

The basic quadrilateral shape is not limited as long as the upper edge and the lower edge are parallel to each other; the basic quadrilateral includes a rectangle, including a square, a trapezoid, and a parallelogram, and among them a rectangle is preferable. With regard to a trapezoid, the upper edge may be shorter or longer than the lower edge.

The area of the basic quadrilateral is no greater than 20 mm$^2$. When it exceeds 20 mm$^2$, since there is a limit, in terms of equipment, for increasing the height of the frame, the frame width becomes too large, and the inner dimensions of the pellicle become too small, thus causing the problem that the pattern area is greatly restricted.

The area of the basic quadrilateral is preferably no greater than 15 mm$^2$, and more preferably no greater than 12 mm$^2$. Furthermore, the area of the basic quadrilateral is preferably at least 2 mm$^2$, and more preferably at least 4 mm$^2$. When it is within the above-mentioned range of values, there is the advantage that, since the frame width can be suppressed so as to be thin, a sufficient pattern area can be obtained.

With regard to the height of the pellicle frame, from the viewpoint of suppression of distortion, the lower the better, but when it is too low the defocusing performance is degraded. That is, if the distance between the pellicle film and the mask becomes small, there is a high possibility of foreign matter on the pellicle film affecting a replicated pattern on a wafer during exposure. Furthermore, because of reasons such as handling becoming difficult when the height of the pellicle frame becomes low, it is necessary for the pellicle frame to have a certain degree of height.

The height of the pellicle frame is preferably about 1 to 10 mm, more preferably about 2 to 7 mm, and particularly preferably about 3 to 6 mm. When the height of the pellicle frame is within the above-mentioned range of values, the defocusing performance for foreign matter is high, and distortion of the pellicle frame is suppressed.

The width of the upper edge and the lower edge of the pellicle frame is preferably 1 to 3 mm, and a width of about 2 mm is preferable in terms of general purpose features.

In the pellicle frame of the present invention, the upper end part and the lower end part preferably have a constant thickness throughout the width. The thickness of the upper end part and the lower end part is preferably 0.1 to 3.0 mm, more preferably 0.2 to 2.0 mm, and yet more preferably 0.3 to 1.0 mm. It is preferable for it to be in the above-mentioned range of values since the pellicle frame is not damaged when the pellicle is peeled off from the exposure master plate.

The cross-sectional area of the pellicle frame bar is preferably no greater than 6 mm$^2$. Furthermore, it is preferably at least 1 mm$^2$, and more preferably at least 3 mm$^2$. By narrowing the width of the middle part of the pellicle frame as in the present invention, even in the case of a basic quadrilateral having a large area, a small cross-sectional area can easily be achieved. By reducing the cross-sectional area in this way, deformation stress can be reduced for a given material, and as a result deformation of the mask can also be reduced. Moreover, since a sufficient width can be given to the upper edge and the lower edge of the pellicle frame, excellent workability such as ease of formation of an adhesion layer can be obtained.

With the area of the basic quadrilateral as 100%, the proportion of the cross-sectional area of the pellicle frame bar is preferably as small as possible since frame flatness and mask flatness can be improved. Specifically, it is preferably 25% to 85%, more preferably 35% to 75%, and yet more preferably 40% to 60%. It is preferable for the cross-sectional area of the pellicle frame bar to be in the above-mentioned range of values since frame and mask flatness can be enhanced while maintaining the strength necessary for the frame.

The cross-section of the pellicle frame bar is characterized by a shape in which at least one side edge of a quadrilateral having parallel upper and lower edges has at least one triangular recess. In the present invention, it is preferable for the recess to be preferably formed in both side edges, and it is more preferable for both side edges to have one each thereof.

Figure 3:
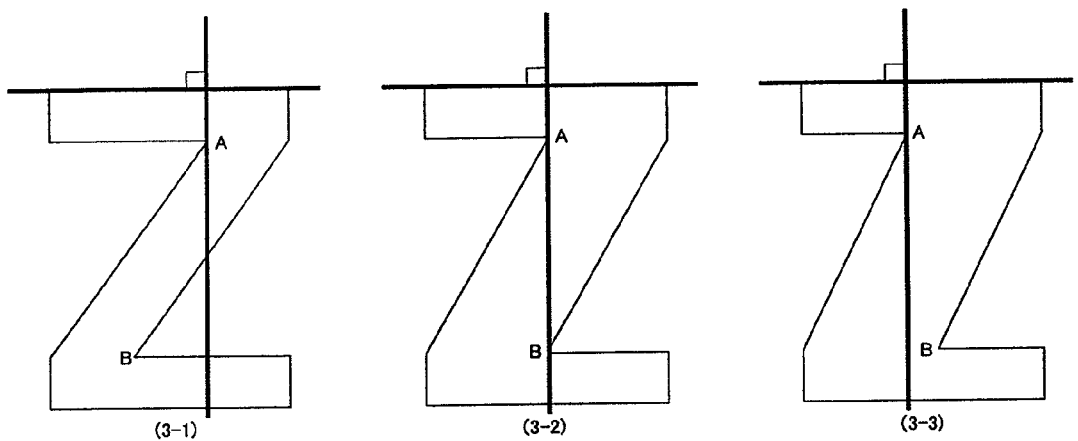
FIG. 3 is a diagram showing a modified example of a recess in the cross-sectional shape of the pellicle frame bar.

In the present invention, the cross-section of the pellicle frame bar is preferably such that both side edges each have one of the recesses and a straight line that passes through the extremity of one of the recesses is perpendicular to the upper edge crosses the other recess. FIGS. 3 (3-1) to (3-3) explain the present embodiments with as an example a cross-sectional shape of the pellicle frame in which a right-angled triangular recess is formed in both side edges of a rectangle.

FIG. 3 (3-1) is a preferable embodiment of the present invention and is an example showing that a straight line that passes through the extremity A of one recess (A in the drawing) and is perpendicular to the upper edge crosses the other recess. In the embodiment shown in (3-1), the recess is made to have a sufficient depth and at the same time the middle part is formed to have a narrow width; as a result the pellicle frame is easily deformed in the lengthwise direction, and a pellicle frame with small deformation stress can therefore be obtained, which is preferable.

FIGS. 3 (3-2) and (3-3) show examples in which a straight line passing through the extremity A of either recess does not cross the other recess. Compared with the example shown in (3-1), the recess formed is shallower and the middle part has a greater width, the deformation stress in the lengthwise direction of the pellicle frame is higher, and as a result the deformation stress of the pellicle frame becomes higher than in the embodiment of FIG. (3-1).

In the present invention, when both side edges each have one of the recesses, it is preferable that a straight line that passes through the extremity of one of the recesses and is perpendicular to the upper edge crosses the other recess.

Figure 4:
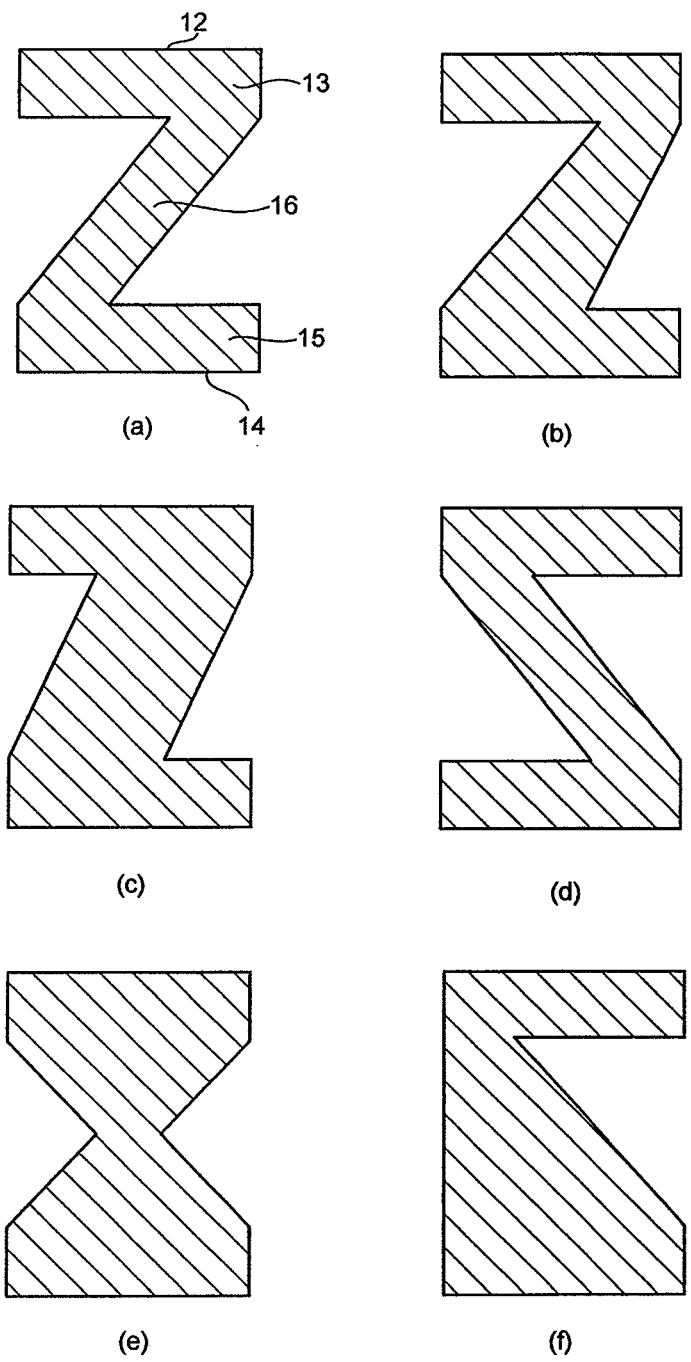
FIG. 4 is a diagram showing a modified example of the cross-sectional shape of the pellicle frame bar.

In the present invention, the cross-section of the pellicle frame bar preferably has a Z shape in which the upper end part and the lower end part are connected by a middle part obtained by removing a right-angled triangle from both opposing side edges of a lengthwise rectangle. FIG. 4 illustrates (a) to (d), which are preferable variations of the Z shape. In each of the drawings of FIGS. 4 (a) to (f), the left-hand side of the drawings is on the outside of the pellicle frame, and the right-hand side is on the inside.

An explanation is given by referring to FIG. 4; the shape of (a) is one example of the above-mentioned Z shape, and is a shape in which the upper end part 13 and the lower end part 15, which have a constant thickness throughout the width, are connected by the middle part 16, which has a constant width, on one diagonal of the basic quadrilateral.

The shape of (b) is different from the shape of (a) in terms of the middle part 16 being in a tapered shape while broadening from the upper end part 13 toward the lower end part 15.

The shape of (c) is different from the shape of (a) in terms of the triangular recess being shallower and the middle part having a broader width.

The shape of (d) is different from the shape of (a) in terms of left and right being inverted, that is, the inside and the outside of the pellicle frame being reversed.

As variations to the above-mentioned Z shapes, (e) and (f) can be illustrated.

With regard to the shape of (e), the quadrilateral is a rectangle, and at least one of the recesses is an isosceles triangle having its vertex placed inside the rectangle. The vertex referred to here is a vertex that is the vertical angle of the isosceles triangle as shown in the drawing.

The shape of (f) is a shape obtained by removing a right-angled triangle from one side edge of the basic quadrilateral.

Modification is also possible with a shape obtained by similarly removing a triangle from a side edge of a trapezoid or a parallelogram as the basic quadrilateral, but in the present invention the basic quadrilateral is preferably a square or a rectangle, and a rectangle is more preferable.

The middle part preferably has a constant width, but may have a wider width closer to the upper end part and/or the lower end part.

In the present invention, those with a Z shape are preferable, and among them (a) and (d), in which the width of the middle part is constant and the recess has a sufficient depth, are more preferable.

The pellicle frame of the present invention is designed as to be appropriate according to the shape of the mask; the plan (top view) shape of the pellicle frame is usually a ring shape or a rectangular shape, and it has a size and a shape that covers a circuit pattern part provided on the mask. The corners of a rectangular (including square) pellicle frame may be rounded or chamfered.

As a material constituting the pellicle frame, aluminum, an aluminum alloy, a magnesium alloy, a synthetic resin, etc. is suitably used, aluminum, an aluminum alloy, a magnesium alloy, or a polycarbonate resin is more suitably used, and aluminum or an aluminum alloy is preferably used from the viewpoint of material availability and general purpose features.

As the aluminum, a conventionally used aluminum alloy material may be preferably used, and a JIS A7075, JIS A6061, JIS A5052 material, etc. may be more preferably used, but it is not particularly limited as long as it has the above-mentioned cross-sectional shape and the strength as a pellicle frame can be ensured.

The pellicle frame of the present invention is preferably constituted from a material having a Young's modulus of 1 to 80 GPa. Furthermore, the pellicle frame of the present invention may preferably be constituted from a material having a Young's modulus of 1 to 50 GPa instead of using a material having a high Young's modulus such as a conventionally commonly used aluminum alloy material. As a material having a Young's modulus in the range of 1 to 50 GPa, a magnesium alloy of 44 GPa, an acrylic resin of 3 GPa, and a polycarbonate resin of 2.5 GPa can be cited as examples. When such a material having a low Young's modulus is used, even if the cross-sectional area exceeds 6 mm$^2$, deformation stress of the pellicle frame can be reduced, and deformation of the mask can be suppressed.

When the cross-sectional shape of a pellicle frame is a Z shape and its cross-sectional area is 3 to 6 mm$^2$, due to a synergistic effect the lower the Young's modulus of the material used, the more the deformation of the mask is suppressed.

In the present invention, the flatness of the pellicle frame is preferably at least 0 μm but no greater than 20 μm, and more preferably at least 0 μm but no greater than 10 μm. When the flatness of the pellicle frame is good, the deformation stress imposed on the pellicle frame when affixing the pellicle to the mask can be suppressed, and as a result the amount of deformation of the mask can be reduced.

The 'flatness' of the pellicle frame is a value obtained by measuring the height of 8 points at positions appropriately separated from each other on the pellicle frame, preferably a total of 8 points, that is, 1 point at each corner of the pellicle frame and 1 point in the middle of each of the 4 edges, calculating an imaginary plane, and subtracting the minimum point from the maximum point with respect to the distance of each point from the imaginary plane. The flatness of the pellicle frame may be measured by a 'laser displacement meter having an XY axis program stage', and in the present invention an above-mentioned displacement meter was used.

In the present invention, it is preferable to C-chamfer a corner in the exposure master plate adhesion face and/or the pellicle film adhesion face of the pellicle frame between the inside and outside faces of the pellicle frame and the exposure master plate adhesion face and/or pellicle film adhesion face. C-chamfering means cutting an intersecting planes portion, that is, a corner, at 45°.

The pellicle frame is produced by a method involving cutting a rolled or extruded sheet material or injection molding. In order to improve the flatness of the frame, polishing is sometimes carried out. In order to prevent corrosion, etc., the surface may be subjected to a surface treatment described below after completing machining.

The surface of the pellicle frame is preferably roughened by sandblasting or chemical abrasion prior to carrying out a surface treatment such as coating with a polymer. In the present invention, the method for roughening the surface of the frame may employ a conventionally known method. It is preferable to employ a method for roughening the surface involving blasting the aluminum alloy material surface with stainless steel, carborundum, glass beads, etc., and further by chemically abrading with NaOH, etc.

In the present invention, in order to absorb stray light, the pellicle frame preferably has a black oxide coating and/or a black polymer coating. Furthermore, when the pellicle frame is made of an aluminum alloy, the pellicle frame made from an aluminum alloy having a black anodized coating (a black almite coating) and/or a polymer electrodeposition-coated film is particularly preferable.

As a method for forming a black anodized coating on the pellicle frame surface, in general, after treating in a treatment bath of an alkali such as NaOH for a few tens of seconds, anodization is carried out in a dilute sulfuric acid aqueous solution, subsequently black staining and sealing treatments are carried out, and a black oxidized coating may thus be provided on the surface.

Furthermore, the polymer coating may be provided by various methods, and in general spray coating, electrostatic coating, electrodeposition coating, etc. can be cited as examples. In the present invention, it is preferable to provide the polymer coating by electrodeposition coating.

With regard to the electrodeposition coating, either a thermosetting resin or a UV curing resin may be used. It is also possible to employ either anionic, electrodeposition coating or cationic electrodeposition coating for the resins. In the present invention, since UV resistance is also required, it is preferable to employ anionic electrodeposition coating of a thermosetting resin in terms of coating stability, appearance, and strength.

(Lithographic Pellicle)

The lithographic pellicle of the present invention may be produced by stretching a pellicle film over one end face, that is, the upper edge, of any of the above-mentioned pellicle frames via a pellicle film adhesive, and providing an exposure master plate adhesive on the other end face, that is, the lower edge.

The type of pellicle film is not particularly limited and, for example, an amorphous fluorine polymer, etc. that has conventionally been used for an excimer laser may be used. Examples of the amorphous fluorine polymer include Cytop (product name, manufactured by Asahi Glass Co., Ltd.) and Teflon® AF (product name, manufactured by DuPont). These polymers may be used by dissolving them in a solvent as necessary when preparing the pellicle film, and may be dissolved as appropriate in, for example, a fluorine-based solvent.

In the Examples and Comparative Example below, mask flatness was measured using an UltraFlat (Tropel).

Furthermore, the maximum deformation range of the mask caused by affixing a pellicle to the mask was used as an index for mask deformation/distortion. Definitions of mask flatness and maximum deformation range and measurement methods therefor are described in the Examples.

In accordance with the present invention, there can be provided a pellicle frame and a lithographic pellicle that can suppress deformation of an exposure master plate due to deformation of a pellicle frame.

EXAMPLES

The present invention is explained below more specifically by reference to Examples. A 'mask' in the Examples and Comparative Example is illustrated as an example of the 'exposure master plate' and, needless to say, application to a reticle can be carried out in the same manner. The present invention is specifically explained below by way of Examples, but the present invention is not limited only to the Examples below.

(Preparation of Pellicle Film)

A 5% solution of Cytop CTX-S (product name, manufactured by Asahi Glass Co., Ltd.) dissolved in perfluorotributylamine was dropped on a silicon wafer and spread over the wafer by rotating the wafer at 830 rpm by a spin coating method. Subsequently, drying was carried out at room temperature (25° C.) for 30 minutes and then at 180° C., thus giving a uniform film. An aluminum framework coated with an adhesive was affixed thereto, and only the film was peeled off, thus giving a pellicle film. The required number of Cytop CTX-S films were prepared and used in Examples 1 to 8 and the Comparative Example.

Example 1

A pellicle frame with outer dimensions of 149 mm×122 mm×3.5 mm and a width of the upper edge and lower edge of 2 mm was prepared from an aluminum alloy (the cross-sectional shape being shown in FIG. 4 (a), and the cross-sectional area being 3.25 mm$^2$). The cross-sectional shape was a Z shape obtained by removing right-angled triangles having a height of 2.5 mm and a width of an upper edge (lower edge) of 1.5 mm from opposite side faces of a rectangle having a height of 3.5 mm and a width of 2.0 mm in a staggered manner on opposite sides of a central part. The thickness of the upper end part and lower end part was 0.5 mm, and the width in the horizontal direction of the middle part was also 0.5 mm. Four corners of the pellicle frame were subjected to C-chamfering.

When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.24 μm. Although the maximum deformation range changed by 30 nm, compared with the Comparative Example, it could be suppressed to a very low value. The results of measurement of flatness and maximum deformation range are summarized in Table 1.

Mask flatness was measured using an UltraFlat (Tropel). Frame flatness was measured using a laser displacement meter having an XY axis program stage.

'Flatness' is defined as the difference between the maximum value and the minimum value of irregularities from an imaginary plane of the pellicle frame or mask.

Furthermore, the 'maximum deformation range of the mask' is defined as the sum of the absolute values of the maximum change on +/− sides for the difference in height of each point of the mask when the profile of the mask is measured twice. When the mask is deformed due to affixing the pellicle, since the maximum deformation range becomes a large value even if the flatness does not change, the maximum deformation range is more effective as an index for mask deformation/distortion than flatness.

Example 2

A pellicle frame having the same cross-sectional shape as Example 1 with outer dimensions of 149 mm×122 mm×3.5 mm and a width of the upper edge and lower edge of 2 mm was prepared from a magnesium alloy (the cross-sectional shape being shown in FIG. 4 (a), and the cross-sectional area being 3.25 mm$^2$). When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the magnesium alloy frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.25 μm, and the flatness did not change. Although the maximum deformation range changed by 25 nm, compared with the Comparative Example, it could be suppressed to a very low value. The results of measurement of the flatness are summarized in Table 1.

Example 3

A pellicle frame having the same cross-sectional shape as Example 1 with outer dimensions of 149 mm×122 mm×3.5 mm and a width of the upper edge and lower edge of 2 mm was prepared from a polycarbonate resin (the cross-sectional shape being shown in FIG. 4 ($a$), and the cross-sectional area being 3.25 mm$^2$). When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the polycarbonate resin frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.25 μm, and no change was observed. Although the maximum deformation range changed by 20 nm, compared with the Comparative Example, it could be suppressed to a very low value. The results of measurement of the flatness are summarized in Table 1.

Example 4

A pellicle frame with outer dimensions of 149 mm×115 mm×4.5 mm and a width of the upper edge and lower edge of 2 mm was prepared from an aluminum alloy (the cross-sectional shape being shown in FIG. 4 ($b$), and the cross-sectional area being 4.625 mm$^2$). In this frame, the cross-section had a Z shape, and the thickness of the upper end part and the lower end part was 0.5 mm. The width in the horizontal direction of the middle part was 0.5 mm for an upper edge connecting part and 1.0 mm for a lower edge connecting part. When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.27 μm. Although the maximum deformation range changed by 55 nm, compared with the Comparative Example, it could be suppressed to a low value. The results of measurement of the flatness are summarized in Table 1.

Example 5

A pellicle frame with outer dimensions of 149 mm×122 mm×3.5 mm and a width of the upper edge and lower edge of 2 mm was prepared from an aluminum alloy (the cross-sectional shape being shown in FIG. 4 ($c$), and the cross-sectional area being 5 mm$^2$). The cross-sectional shape was a Z shape obtained by removing a right-angled triangle having a height of 2.5 mm and an upper edge (lower edge) of 0.8 mm from opposite side faces of a rectangle having a height of 3.5 mm and a width of 2.0 mm in a staggered manner on opposite sides of a central part. The thickness of the upper end part and lower end part was 0.5 mm, and the width in the horizontal direction of the middle part was 1.2 mm. When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.27 μm. Although the maximum deformation range changed by 58 nm, compared with the Comparative Example, it could be suppressed to a low value. The results of measurement of the flatness are summarized in Table 1.

Example 6

A pellicle frame with outer dimensions of 149 mm×115 mm×3 mm and a width of the upper edge and lower edge of 2 mm was prepared from an aluminum alloy (the cross-sectional shape being shown in FIG. 4 ($d$), and the cross-sectional area being 3 mm$^2$). The cross-sectional shape was an inverted Z shape in which left and right were inverted from the shape of ($a$). When the flatness of this frame was measured from the side that was to be coated with a mask pressure-sensitive adhesive, it was found to be 10 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.25 μm, and no change was observed. Although the maximum deformation range changed by 25 nm, compared with the Comparative Example, it could be suppressed to a very low value. The results of measurement of the flatness are summarized in Table 1.

Example 7

A pellicle frame with outer dimensions of 149 mm×122 mm×3.5 mm and a width of the upper edge and lower edge of 2 mm was prepared from an aluminum alloy (the cross-sectional shape being shown in FIG. 4 ($e$), and the cross-sectional area being 5.125 mm$^2$). The cross-sectional shape was a shape obtained by removing an isosceles triangle, having a bottom edge of 2.5 mm and a height from the bottom edge to the vertex forming a vertical angle of 0.75 mm, from opposite side faces of a rectangle having a height of 3.5 mm and a width of 2.0 mm. The width of the narrowest part in the middle part was 0.5 mm. When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.23 μm. Although the maximum deformation range changed by 60 nm, compared with the Comparative Example, it could be suppressed to a low value. The results of measurement of the flatness are summarized in Table 1.

Comparative Example

A pellicle frame with outer dimensions of 149 mm×122 mm×3.5 mm and a width of 2 mm was prepared from an aluminum alloy (the cross-sectional shape being a rectangular, and the cross-sectional area being 7 mm$^2$). When the flatness of this frame was measured from the side that was to be coated with a mask pressure-sensitive adhesive, it was found to be 20 μm.

The pellicle film was affixed in the same manner as in Example 1, thus completing a pellicle. The pellicle thus completed was affixed to the mask in the same manner as in Example 1, and the flatness of the pellicle-equipped mask was measured again. The measurement results are summarized in Table 1.

The results above are all as shown in Table 1 below.

TABLE 1

| | Pellicle Frame | | | | | | Measurement value | | | |
|---|---|---|---|---|---|---|---|---|---|---|
| Examples and Comp. Ex. | Cross-sectional shape in FIG. 4 | Width of upper and lower edges (mm) | Height (mm) | Cross-sectional area (mm$^2$) | Material | Young's Modulus (GPa) | Frame flatness (μm) | Before affixing (μm) | After affixing (μm) | Maximum deformation range (nm) |
| | | | | | | | | Mask flatness | | |
| Example 1 | (a) | 2.0 | 3.5 | 3.250 | Al alloy | 69 | 20 | 0.25 | 0.24 | 30 |
| Example 2 | (a) | 2.0 | 3.5 | 3.250 | Mg alloy | 44 | 20 | 0.25 | 0.25 | 25 |
| Example 3 | (a) | 2.0 | 3.5 | 3.250 | PC resin | 2.5 | 20 | 0.25 | 0.25 | 20 |
| Example 4 | (b) | 2.0 | 4.5 | 4.625 | Al alloy | 69 | 20 | 0.25 | 0.27 | 55 |
| Example 5 | (c) | 2.0 | 3.5 | 5.000 | Al alloy | 69 | 20 | 0.25 | 0.27 | 58 |
| Example 6 | (d) | 2.0 | 3.0 | 3.000 | Al alloy | 69 | 10 | 0.25 | 0.25 | 25 |
| Example 7 | (e) | 2.0 | 3.5 | 5.125 | Al alloy | 69 | 20 | 0.25 | 0.23 | 60 |
| Example 8 | (f) | 2.0 | 3.5 | 5.125 | Al alloy | 69 | 20 | 0.25 | 0.27 | 65 |
| Comp. Ex. | Rectangle | 2.0 | 3.5 | 7.000 | Al alloy | 69 | 20 | 0.25 | 0.29 | 100 |

Al alloy: an aluminum alloy
Mg alloy: a magnesium alloy
PC resin: a polycarbonate resin Example 8

A pellicle frame with outer dimensions of 149 mm×122 mm×3.5 mm and a width of the upper edge and lower edge of 2 mm was prepared from an aluminum alloy (the cross-sectional shape being shown in FIG. 4 (f), and the cross-sectional area being 5.125 mm$^2$). The cross-sectional shape was a shape obtained by removing a right-angled triangle having a height of 2.5 mm and a width of 1.5 mm from one side face of a rectangle having a height of 3.5 mm and a width of 2.0 mm. The thickness of the upper end part was 0.5 mm. When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.27 μm. Although the maximum deformation range changed by 65 nm, compared with the Comparative Example, it could be

The invention claimed is:

1. A pellicle frame comprising a pellicle frame bar having a cross-section with a shape that has at least one triangular recess in at least one side edge of a rectangle having an upper edge and a lower edge parallel to each other and a cross-sectional area of no greater than 20 mm$^2$, said at least one triangular recess not including any part of said upper edge and said lower edge.

2. The pellicle frame according to claim 1, wherein said at least one recess is a triangle that has an edge parallel to the upper edge of the rectangle.

3. The pellicle frame according to claim 1, wherein said at least one recess is an isosceles triangle having a vertex placed inside the rectangle.

4. The pellicle frame according to claim 1, wherein the rectangle has one recess in each of opposite side edges, and a straight line that passes through an extremity of one recess and is perpendicular to the upper edge of the rectangle crosses the other recess.

5. The pellicle frame according to claim 1, wherein the pellicle frame bar has a cross-sectional area of at least 1 mm$^2$ but no greater than 6 mm$^2$.

6. The pellicle frame according to claim 1, wherein the pellicle frame is formed from a material having a Young's modulus of 1 to 80 GPa.

7. The pellicle frame according to claim 1, wherein the pellicle frame is formed from a material selected from the group consisting of an aluminum alloy, a magnesium alloy, and a polycarbonate resin.

8. The pellicle frame according to claim 1, wherein the pellicle frame is formed from an aluminum alloy.

9. The pellicle frame according to claim 1, wherein the pellicle frame has a flatness of at least 0 μm but no greater than 20 μm.

10. The pellicle frame according to claim 1, wherein the rectangle has an area of at least 4 mm$^2$ but no greater than 20 mm$^2$.

11. The pellicle frame according to claim 1, wherein the cross-section of the pellicle frame bar has a shape in which an upper end part and a lower end part having a constant thickness throughout the width are connected by a middle part having a constant width along one diagonal of the rectangle.

12. A lithographic pellicle comprising a pellicle film stretched over one end face of the pellicle frame according to claim 1 via a pellicle film adhesive, and comprising an exposure master plate adhesive on the other end face.

* * * * *